(12) United States Patent
Nagakubo et al.

(10) Patent No.: US 9,543,112 B2
(45) Date of Patent: Jan. 10, 2017

(54) SPECIMEN CRYO HOLDER AND DEWAR

(71) Applicant: Hitachi High-Technologies Corporation, Minato-ku, Tokyo (JP)

(72) Inventors: Yasuhira Nagakubo, Tokyo (JP); Takashi Mizuo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/410,235

(22) PCT Filed: Jun. 4, 2013

(86) PCT No.: PCT/JP2013/065427
§ 371 (c)(1),
(2) Date: Dec. 22, 2014

(87) PCT Pub. No.: WO2014/002700
PCT Pub. Date: Jan. 3, 2014

(65) Prior Publication Data
US 2015/0340199 A1 Nov. 26, 2015

(30) Foreign Application Priority Data
Jun. 28, 2012 (JP) .................. 2012-145599

(51) Int. Cl.
*G21K 5/10* (2006.01)
*H01J 37/20* (2006.01)
*H01J 37/26* (2006.01)

(52) U.S. Cl.
CPC ............... *H01J 37/20* (2013.01); *H01J 37/26* (2013.01); *H01J 2237/184* (2013.01);
(Continued)

(58) Field of Classification Search
CPC ........................................................ H01J 37/20
(Continued)

(56) References Cited

U.S. PATENT DOCUMENTS 4,033,003 A * 7/1977 Marroquin ............. B21K 1/463
411/403
4,833,330 A * 5/1989 Swann .................... H01J 37/02
250/442.11
(Continued)

FOREIGN PATENT DOCUMENTS

JP 52-123862 10/1977
JP 7-39729 U 7/1995
(Continued)

OTHER PUBLICATIONS

International Search Report (PCT/ISA/210) dated Jul. 2, 2013, with English translation (four (4) pages).
(Continued)

*Primary Examiner* — Jason McCormack
(74) *Attorney, Agent, or Firm* — Crowell & Moring LLP

(57) ABSTRACT

In an existing specimen cryo holder, a change in the orientation of a specimen would lead to tilting of a dewar together with the specimen and hence to bubbling of a cooling source contained in the dewar. In view of this, a specimen cryo holder, including a mechanism capable of cooling a specimen while keeping the posture of a dewar in a fixed direction even when the specimen is tilted into a direction suitable for processing or observation thereof, is provided. Also provided is a dewar in which a vacuum maintenance mechanism is mounted to an outer vessel so that an inner vessel holding a cooling source therein is vacuum-insulated from the outside air.

9 Claims, 7 Drawing Sheets

(52) U.S. Cl.
CPC ............... *H01J 2237/2001* (2013.01); *H01J 2237/2002* (2013.01); *H01J 2237/20207* (2013.01)

(58) Field of Classification Search
USPC ........... 250/306, 307, 440.11, 442.11, 443.1, 250/492.1, 492.2, 492.21, 492.3
See application file for complete search history.

(56) References Cited

U.S. PATENT DOCUMENTS

| | | | |
|---|---|---|---|
| 5,274,237 A * | 12/1993 | Gallagher | G01T 1/00 250/370.15 |
| 5,753,924 A | 5/1998 | Swann | |
| 5,986,270 A | 11/1999 | Bormans et al. | |
| 6,410,925 B1 | 6/2002 | Armbruster et al. | |
| 6,414,322 B1 * | 7/2002 | Carroll | H01J 37/20 250/442.11 |
| 2007/0029266 A1 * | 2/2007 | Munekane | B81C 99/002 211/13.1 |
| 2012/0024086 A1 * | 2/2012 | Stabacinskiene | G01N 23/20033 73/864.91 |

FOREIGN PATENT DOCUMENTS

| | | |
|---|---|---|
| JP | 2774884 B2 | 4/1998 |
| JP | 10-275582 A | 10/1998 |
| JP | 11-96953 A | 4/1999 |
| JP | 2000-513135 A | 10/2000 |
| JP | 2004-508661 A | 3/2004 |
| JP | 2010-257617 A | 11/2010 |
| JP | 2012-33335 A | 2/2012 |

OTHER PUBLICATIONS

T. Ohnishi, et al., "A New Focused-Ion-Beam Microsampling Technique for TEM Observation of Site-specific Area's", Proceeding From the 25$^{th}$ International Symposium for Testing and Failure Analysis, Nov. 14-18, 1999, pp. 449-453 (five (5) pages).

* cited by examiner

USE EXAMPLE (a)

USE EXAMPLE (b)

F I G . 5
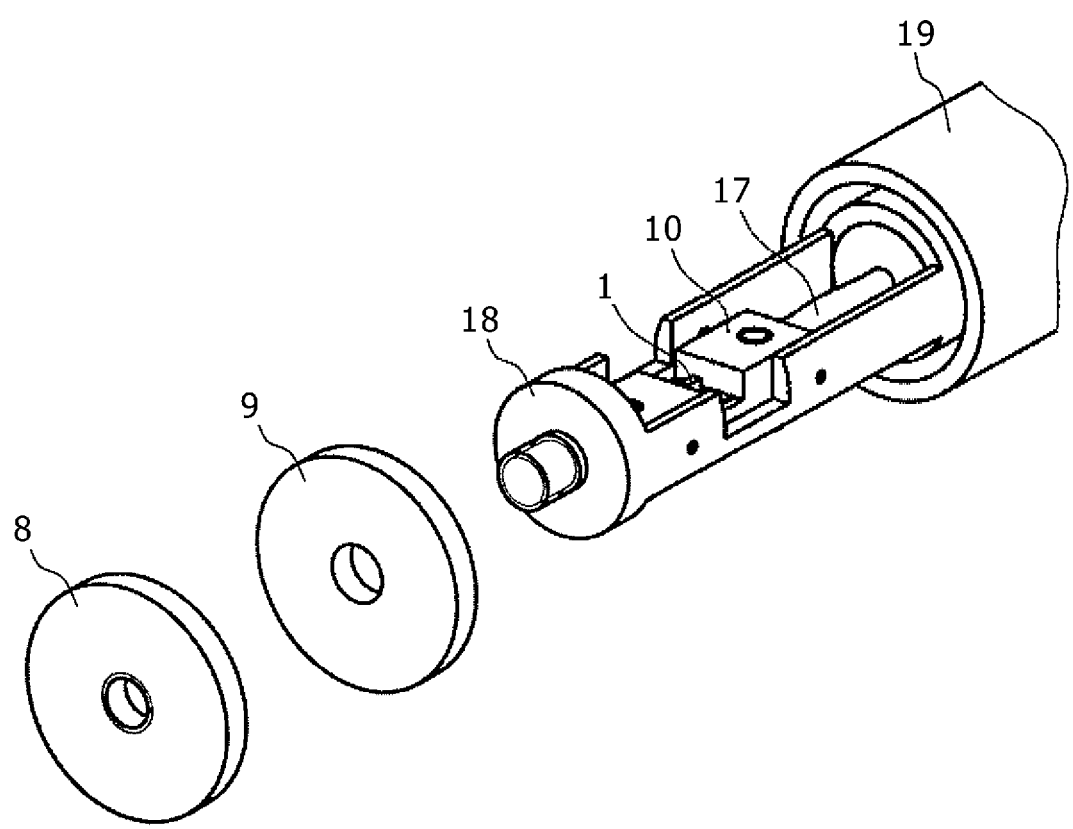

F I G . 7
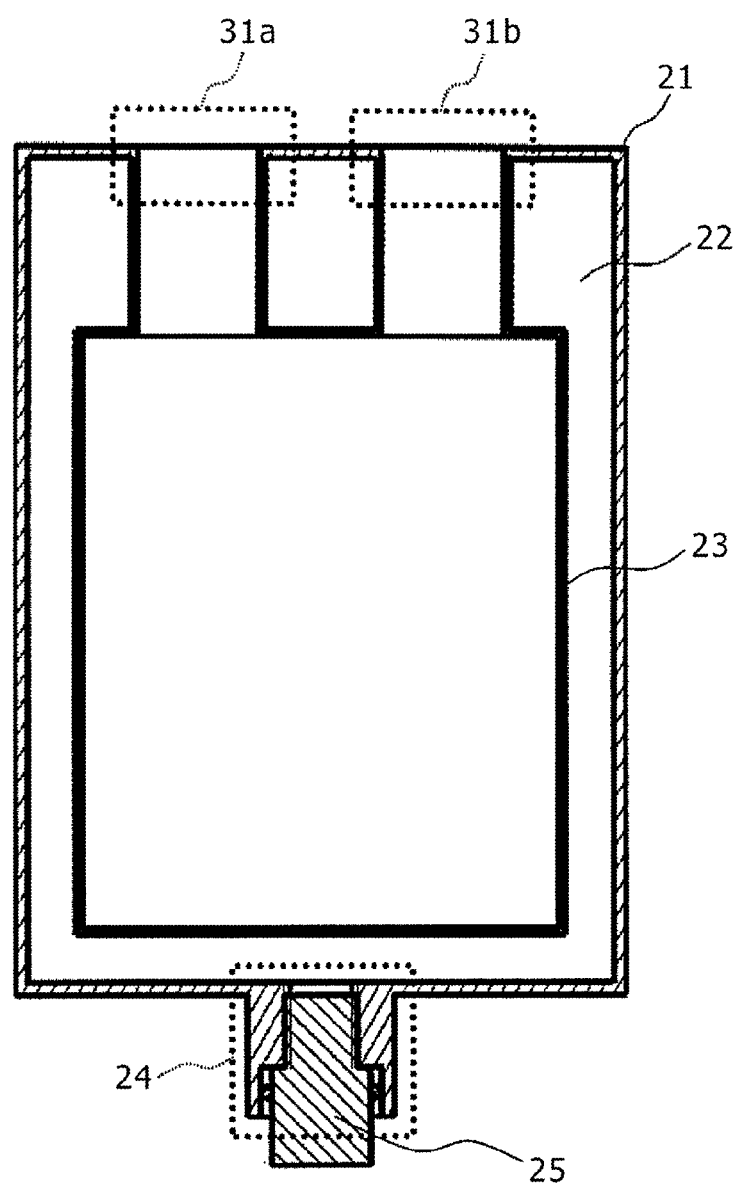

SPECIMEN CRYO HOLDER AND DEWAR

TECHNICAL FIELD

The present invention relates to a specimen cryo holder used with a charged-particle system (for example, focused ion beam system (FIB system), transmission electron microscope (TEM), or scanning transmission electron microscope (STEM)). In addition, the present invention relates also to a dewar which is suitably mounted to a specimen cryo holder.

BACKGROUND ART

An FIB system is a system capable of processing a specimen into an arbitrary shape by irradiating the specimen with a focused beam of charged particles. In particular, an FIB system having a microprobe is capable of extracting a minute specimen from an arbitrary site of a specimen. This technique of extraction is called an FIB microsampling method. The FIB microsampling method is a method suitable for producing a specimen needed when analysis of a state or structure on the order of several nanometers is performed by use of an electron microscope or the like, with such analysis being a subject of research in nanotechnology (Patent Document 1).

PRIOR ART DOCUMENTS

Patent Documents

Patent Document 1: Japanese Patent No. 2774884
Patent Document 2: JP-11-96953-A
Patent Document 3: JP-10-275582-A
Patent Document 4: U.S. Pat. No. 5,986,270 A
Patent Document 5: JP-2000-513135-A
Patent Document 6: JP-2004-508661-A
Patent Document 7: JP-2010-257617-A

Non-Patent Document

Non-patent Document 1: Ohnishi T., Koike H., Ishitani T., Tomimatsu S., Umemura K., and Kamino T., Proc. 25th Int. Symp. Test. And Fail. Anal. (1999) 449-453.

SUMMARY OF THE INVENTION

Problem to be Solved by the Invention

Meanwhile, when a thin film specimen produced is observed under an electron microscope, an effect of an electron beam may raise the temperature of the specimen so as to make it difficult to analyze the intrinsic state or structure of the specimen. Especially, a specimen susceptible to thermal damage is generally low in thermal conductivity, so that charge-up and thermal conduction properties of the specimen contribute greatly to the thermal damage. As a countermeasure against this problem, there has been proposed a method of cooling a specimen under observation (Patent Document 2). A specimen cryo holder proposed in Patent Document 2, however, is unable to efficiently transfer the heat of a cooling source to a specimen, but is only able to barely cool the specimen.

Besides, in order to observe a thin film specimen under an electron microscope, irradiation with the electron beam should be performed perpendicularly to the thin film surface. Therefore, this kind of specimen cryo holder generally needs a mechanism by which the orientation of the specimen can be tilted. For instance, an observation of a crystalline specimen needs a tilting mechanism with respect to at least one axis. In the case of existing specimen cryo holders, however, a vessel in which a cooling source (for example, liquid nitrogen) is contained (the vessel will hereinafter be referred to as "dewar") is fixed to the tilting mechanism. Therefore, a tilting of the specimen cryo holder causes the vessel to be also tilted, and the free surface level of liquid nitrogen in the vessel is changed, resulting in boiling (bubbling). Vibrations due to the boiling are propagated through the specimen cryo holder to the specimen, rendering the observation of the specimen difficult. Accordingly, there is a need for a specimen cryo holder equipped with a tilting mechanism such that a specimen having a low thermal conductivity can be observed with efficient cooling thereof.

Note that during processing by use of an FIB system, the specimen temperature may rise depending on the processing conditions. Especially Where the object of processing is a thermally weak resin, a low-melting-point metal, a low-temperature phase change matter or the like, it is preferable to process the specimen while cooling the specimen.

In general, part of the energy of charged particles colliding on a processing position is used for sputtering, but the rest of the energy is taken into the inside of the specimen and transformed into thermal energy. The thermal energy is propagated through the inside of the specimen to diffuse to a cooling region, and, after a predetermined period of time, the specimen temperature is stabilized in the vicinity of a target temperature.

However, where the thermal energy given by the irradiation with charged particles surpasses the quantity of heat transferred from the cooling source to the cooling region, the specimen temperature would be raised. In order to process a specimen by charged particles while cooling the specimen, therefore, it is necessary to appropriately control the cooling temperature, charged-particle irradiation conditions and the like, taking into account the heat transfer characteristics and the form of the specimen. In the existing specimen cryo holders, however, the quantity of heat transferred is very small, as aforementioned, so that the control itself is difficult to achieve.

Besides, in processing by an FIB system, the processing should be carried out while radiating an ion beam from a parallel direction to a thin film surface. In the existing specimen cryo holders, however, the vessel containing the cooling source (for example, liquid nitrogen) is fixed to the tiling mechanism, as aforementioned, so that a tilting of the specimen cryo holder would cause the vessel to be tilted together. This results in boiling (bubbling) of the liquid nitrogen, and the resulting vibrations are propagated to the specimen to be processed. Accordingly, in the cases of FIB systems, also, there is a need for realization of a specimen cryo holder equipped with a tilting function such that a specimen having a low thermal conductivity can be processed simultaneously with efficient cooing thereof.

The present invention has been made in consideration of the above-mentioned problem. Accordingly, it is an object of the invention to provide a specimen cryo holder equipped with a tiling function such that a specimen can be cooled during processing or observation thereof, and a dewar for the same.

Means for Solving the Problem

For solving the above problem, a specimen cryo holder according to the present invention has a mechanism capable of cooling a specimen while maintaining the posture of a dewar in a fixed direction even when the specimen is tilted into a direction suitable for processing or observation thereof. In addition, a dewar according to the present invention has a vacuum maintenance mechanism on an outer vessel by which an inner vessel holding a cooling source therein is vacuum-insulated from outside air.

Effect of the Invention

According to the specimen cryo holder of the present invention, a specimen can be tilted into a direction suitable for processing or observation thereof using charged particles, while efficiently cooling the specimen. The use of the dewar according to the present invention makes it possible to enhance vacuum insulation performance during observation or processing, and to maintain cooling of a specimen by use of a cooling source for a long time. Other problems, configurations and effects than the aforementioned will become clear upon reading the description of an embodiment that follows.

BRIEF DESCRIPTION OF THE DRAWINGS

FIG. 5 is a perspective view depicting a tip part of the specimen cryo holder.

FIG. 7 illustrates a sectional structure of the dewar which is mounted to the specimen cryo holder

MODE FOR CARRYING OUT THE INVENTION

Now, a mode for carrying out the present invention will be described below, based on the drawings. Note that the way in which the present invention is embodied is not limited to the exemplary mode described below, and various modifications are possible within the scope of the technical idea of the invention.

Figure 1A:
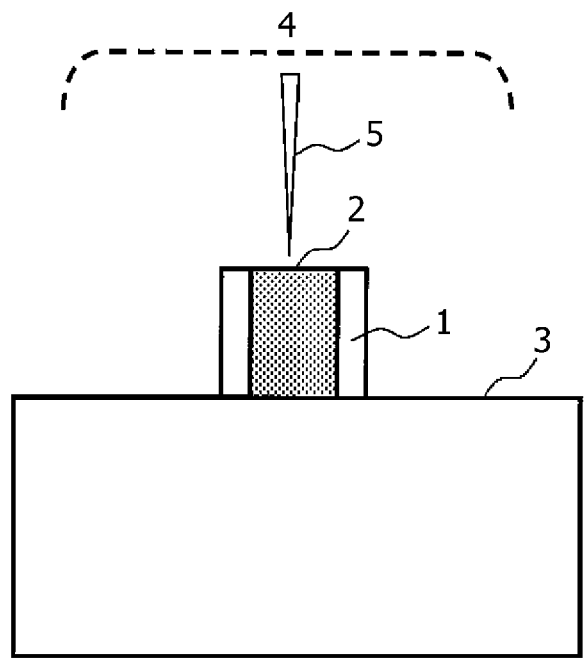
FIG. 1A is a schematic view of a specimen base for cooling a specimen, depicting the positional relationship between the specimen and charged particles in a charged-particle system for processing.
Figure 1B:
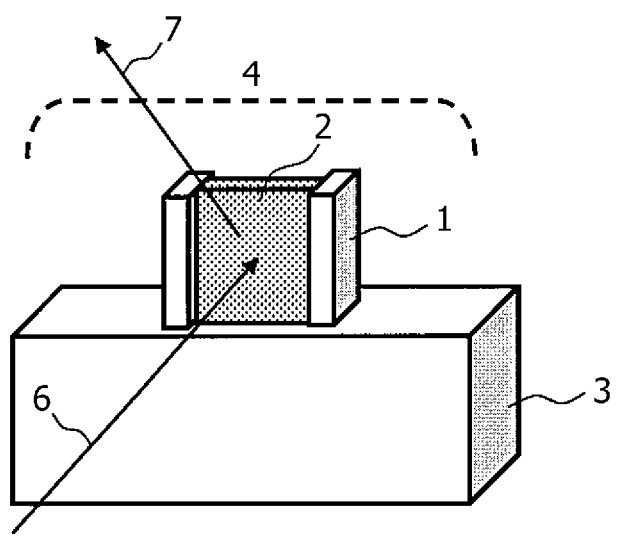
FIG. 1B is a schematic view of the specimen, base for cooling a specimen, depicting the positional relationship between the specimen and charged particles in a charged-particle system for observation.

First, a difference between the positional relationship between, charged particles and a specimen at the time of processing the specimen and that at the time of observing the specimen will be described. FIG. 1A depicts the positional relationship between charged particles and a specimen at the time of processing of the specimen, while FIG. 1B depicts the positional relationship between charged particles and a specimen at the time of observation of the specimen.

A specimen 1 is a minute specimen produced, for example, by an FIB microsampling method. A processing/observation region 2 with which the specimen 1 is provided is not greater than 10 μm square, in the cases of normal processing or observation. Note that the specimen 1 is adhered directly to a cryo specimen base 3, which is cooled by a cooling source.

At the time of processing (FIG. 1A), the minute region is irradiated with charged particles 5 (for example, an ion beam) from a direction horizontal to a thin film surface of the specimen 1, via a space 4. At the time of observation (FIG. 1B), on the other hand, the minute region is irradiated with charged particles 6 (e.g., an electron beam) from a direction perpendicular to the thin film surface of the specimen 1, via the space 4. In either case, processing and observation can be performed while cooling the specimen 1. Note that in either case, heat generated in the minute region should be efficiently dissipated to the cryo specimen base 3, in order to enhance a cooling effect. In the case of this embodiment, a structure is adopted in which the processing/observation region 2 is closely spaced, by a distance of not more than a few micrometers, from the cryo specimen base 3. Consequently, a high cooling effect can be expected.

Note that during observation. (FIG. 1B), a signal 7 (e.g., characteristic X-rays or secondary electrons (reflected electrons)) outputted from the specimen 1 passes the space 4, to be efficiently detected by a detector. Though not shown in FIGS. 1A and 1B, a holder to which the cryo specimen base 3 is mounted is provided with a mechanism capable of tilting the specimen in a vertical direction in the drawing. Thus, processing and observation can be performed as aimed at.

Embodiment 1

General Configuration

Figure 2:
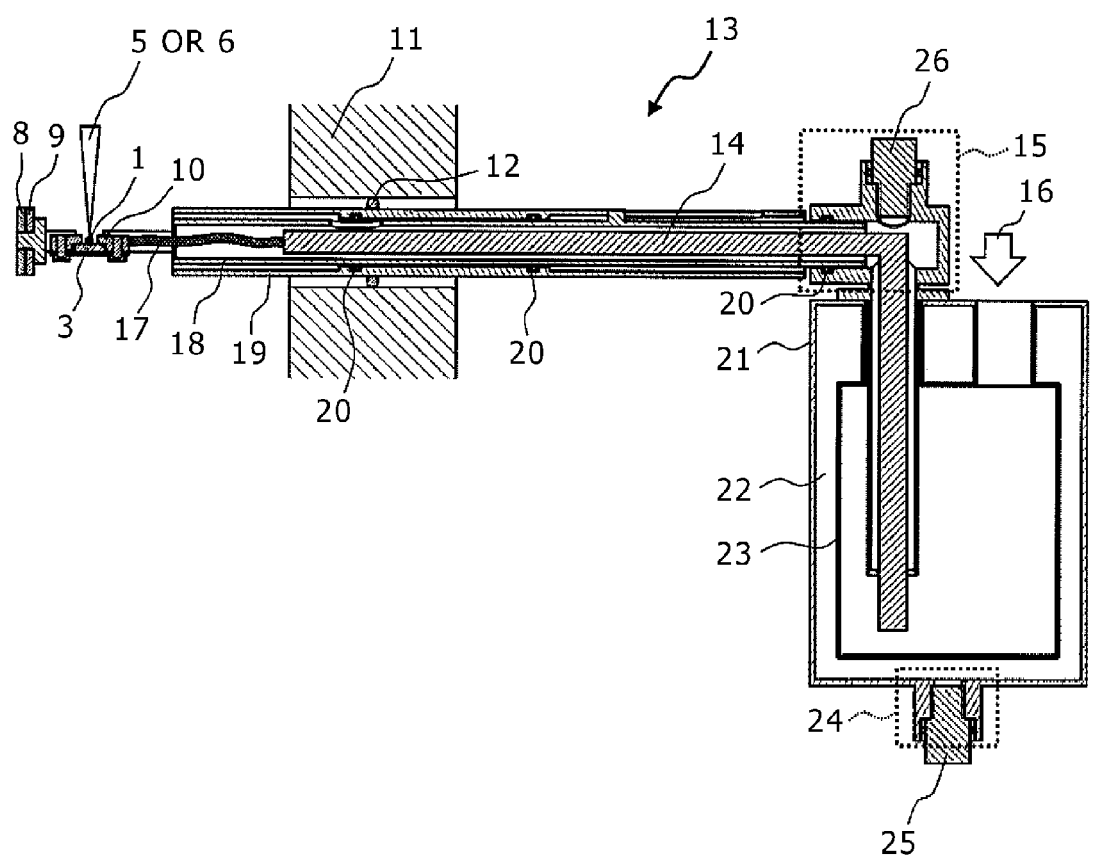
FIG. 2 illustrates a mounted state of a specimen cryo holder mounted to a charged-particle system, and a sectional structure of the specimen cryo holder.

FIG. 2 depicts a state where a specimen cryo holder 13 with a dewar mounted thereto is mounted to a holder receiving part 11 of a charged-particle system. The specimen cryo holder 13 is slidably and/or rotatably mounted to the holder receiving part 11 by way of an O-ring 12.

The specimen cryo holder 13 includes: a shutter 19 constituting an outer tube; a heat shield 18 constituting an inner tube; an L-shaped cooling rod 14 of which a part is accommodated in the inner tube; and a dewar mounting part 15 which holds the heat shield 18 such that the heat shield 18 is rotatable and holds the cooling rod 14. The dewar mounting part 15 holds the cooling rod 14, with a part of the cooling rod 14 inserted in an opening provided in a lower-side portion thereof. The part of the cooling rod 14 protrudes from a lower surface of the dewar mounting part 15 so that when a dewar is mounted to the lower surface of the dewar mounting part 15, the part of the rod makes contact with a cooling source 16.

Here, the cooling rod 14 is not fixed to either the inside of the heat shield 18 or the inside of the dewar mounting part 15. When it is desired to fix the cooling rod 14 to the inside of the heat shield 18, a locking mechanism 26 is used. The locking mechanism 26 in this embodiment locks the cooling rod 14 by pressing the cooling rod 14 against the inside of the heat shield 18 when pressed in; when pressed in again, the locking mechanism 26 unlocks the cooling rod 14.

As will be described later, the dewar is fixedly mounted to the dewar mounting part 15 via a screw or screws or the like. Incidentally, the dewar mounting part 15 and the heat shield 18 are rotatably mounted to each other through O-rings 20. The shutter 19 is so mounted as to be reciprocally movable along a surface of the heat shield 18, by way of the O-rings 20.

In this embodiment, a tip portion (a portion on the specimen attaching side) of the heat shield 18 is partly cut so that opposed two arms protrude in the axial direction so that a cryo specimen base support 10 can be held between the two arms. Here, the cryo specimen base support 10 and the cooling rod 14 are linked to each other via a flexible cooling transfer member (for example, a tubular metallic mesh) 17. The flexible cooling transfer member 17 is a freely deformable member. Therefore, the cryo specimen base support 10 is separated from the cooling rod 14, and only the cryo specimen base support 10 can be tilted (rotated in the axial direction of the heat shield 18) independently of the cooling rod 14.

The cryo specimen base 3 with the specimen 1 mounted thereto is mounted to the cryo specimen base support 10. Therefore, that the cryo specimen base support 10 can be tilted independently of the cooling rod 14 means that the specimen 1 can be tilted independently of the cooling rod 14. A process up to fixation of the specimen 1 to the cryo specimen base 3 has already been known (Non-patent Document 1). Accordingly, description of this process is omitted here.

Since the cryo specimen base support 10 is fixed to the heat shield 18 as aforementioned, rotating the heat shield 18 relative to the dewar mounting part 15 causes the cryo specimen base support 10 to rotate together with the heat shield 18, whereby the orientation of the specimen 1 is rotated. The reason why the cryo specimen base support 10 and the heat shield 18 can be rotated lies in that the cryo specimen base support 10 and the cooling rod 14 are linked to each other via the flexible cooling transfer member 17, as aforementioned.

The cryo specimen base 3 can be detached from the cryo specimen base support 10 after processing/observation is finished. Naturally, when processing/observation is to be performed again, the cryo specimen base 3 can be mounted to the cryo specimen base support 10. A structure for detachably mounting the cryo specimen base 3 to the cryo specimen base support 10 will be described later.

In addition, a holder tip shield 9 and a holder tip shield retainer 8 are sequentially attached to a tip portion of the heat shield 18. The holder tip shield 9 is a member for hermetically sealing the inside of the shutter 19 by making secure contact with an end portion of the shutter 19 when the shutter 19 is slid, toward the tip of the heat shield 18 along the axis of the heat shield 18. Besides, the holder tip shield retainer 8 is a member for preventing the holder tip shield 9 from falling off.

The dewar has a double vessel structure composed of an inner dewar 23 which holds the cooling source (e.g., liquid nitrogen) 16 therein, and an outer dewar 21 which accommodates the inner dewar 23, with a heat shield 22 therebetween. The heat shield 22 is maintained in a vacuum state. Therefore, the inner dewar 23 is perfectly thermally insulated from the exterior of the outer dewar 21 by the heat shield 22.

An upper surface of the inner dewar 23 is formed with two openings. The cooling rod 14 is inserted in one of the two openings, and the other of the two openings is used for introducing the cooling source 16.

In this embodiment, a lower surface of the outer dewar 21 is formed with an evacuation port 24, to which is attached a vacuum maintenance cap 25. The evacuation port 24 is used for evacuating the heat shield 22. The vacuum maintenance cap 25 is used for maintaining the heat shield 22 evacuated in a high vacuum state. As aforementioned, the dewar is detachably mounted to the specimen cryo holder by a screw or screws or the like.

<Orientation of Specimen in Use>

Figure 3A:
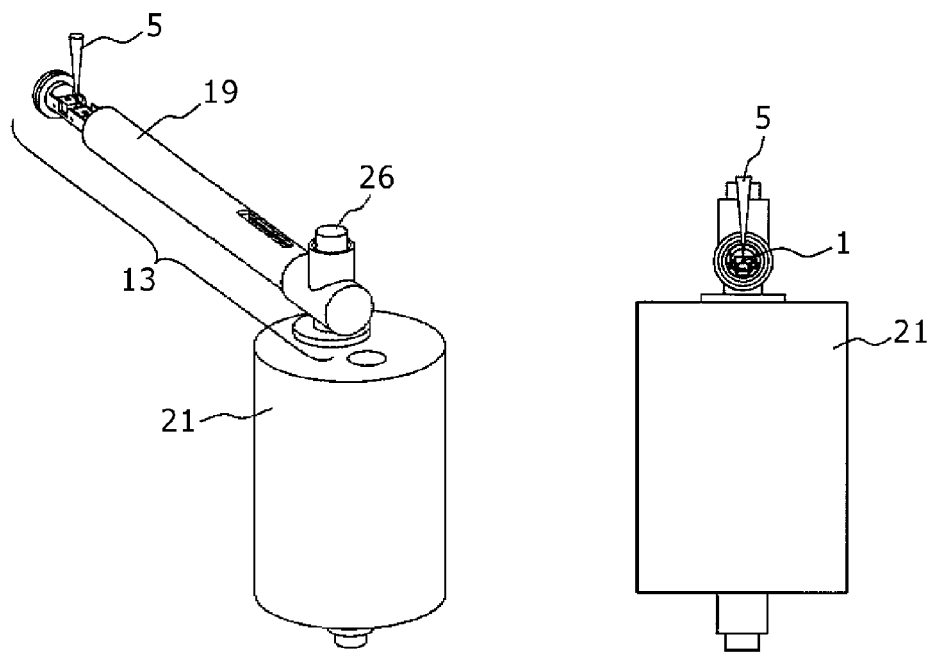
FIG. 3A shows views depicting the positional relationship between a specimen and charged particles and the positional relationship between the specimen cryo holder and a dewar, in the case where the specimen is horizontally irradiated with the charged particles.
Figure 3B:
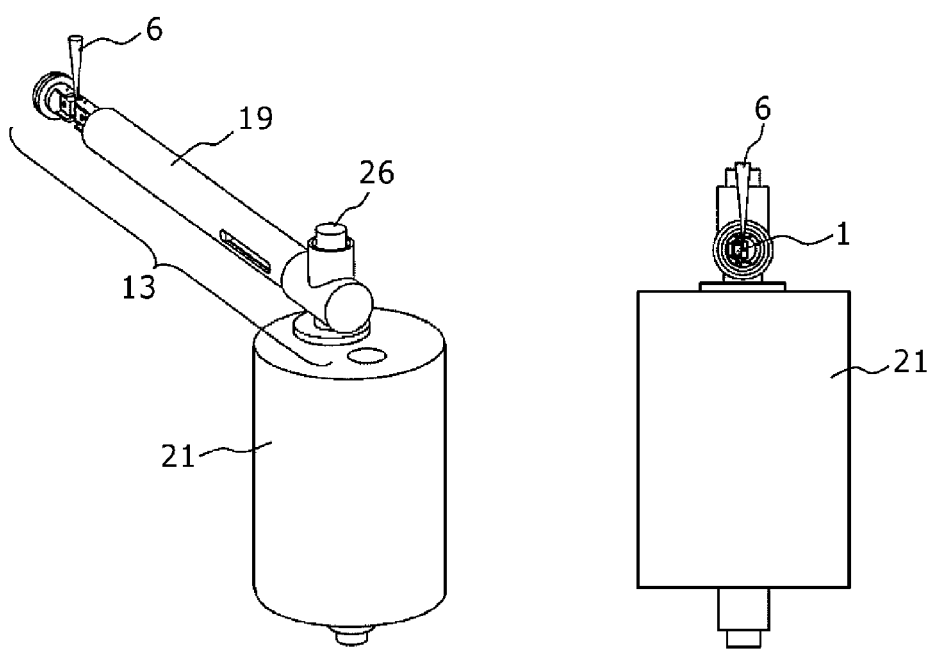
FIG. 3B shows views depicting the positional relationship between a specimen and charged particles and the positional relationship between the specimen cryo holder and the dewar, in the case where the specimen is perpendicularly irradiated with the charged particles.

FIG. 3A depicts the positional relationship between a specimen and charged particles and the positional relationship between the specimen cryo holder and the dewar, in processing the specimen. On the other hand, FIG. 3B depicts the positional relationship between a specimen and charged particles and the positional relationship between the specimen cryo holder and the dewar, in observing the specimen. Note that in a right view in each of FIGS. 3A and 3B, the direction perpendicular to the sheet surface of the drawing is the longitudinal direction of the specimen cryo holder 13.

In an FIB system for producing a thin film specimen, as shown in FIG. 3A, a specimen 1 is disposed in parallel to charged particles 5 (here, an ion beam) discharged via an objective lens (not shown), and a front side and a back side with respect to a surface to be processed/observed of the specimen 1 are alternately processed, so as to produce a thin film specimen while keeping a cooled state. Note that heat from the cooling source 16 is propagated through the cooling rod 14, the flexible cooling transfer member 17, the cryo specimen base support 10 and the cryo specimen base 3 to the specimen 1.

In this instance, the cooling rod 14 is in an unlocked state. Since the cooing rod 14 is kept unlocked, even if a tilt angle of the specimen 1 is changed (namely, even if the heat shield 18 is rotated about a center axis of the cooling rod 14), the cooling rod 14 would not rotate together with the heat shield 18, and the dewar would not rotate together with the dewar mounting part 15. In other words, the cooling source 16 held in the dewar is kept as it is in a horizontal state. Even if bubbling is generated in the cooling source 16 by an external cause or the like, the resulting vibration is propagated wholly through the flexible cooling transfer member 17 and is attenuated. Therefore, the accuracy of processing/observation can be effectively prevented from being lowered.

In an electron microscope for observation of the thin film specimen produced, as shown in FIG. 3B, the thin film specimen is disposed substantially perpendicularly to charged particles 6 (here, an electron beam). The disposition of the specimen 1 in FIG. 3B is inclined by 90 degrees from the direction in which the specimen 1 has been orientated at the time of thin film specimen production in FIG. 3A. Naturally, the cooling rod 14 is in an unlocked state. In addition, an integral rotation of the shutter 19 and the heat shield 18 is absorbed by a deformation in a twisting direction of the flexible cooling transfer member 17. Accordingly, a rotation (tilting) of the shutter 19 and the heat shield 18 does not influence a rotation (tilting) of the cooling rod 14.

In the electron microscope, observation using a transmission wave or the like is performed with the specimen 1 in a cooled state. A signal 7 (e.g., characteristic X-rays) emitted from the specimen 1 passes a space 4 (not shown), and is detected efficiently by a detector, to be utilized for specimen evaluation. For the observation here, the specimen 1 having a crystalline structure has to be tilted into a vertical (upand-down) and in-plane direction in regard of the sheet surface of the drawing, as has been mentioned above. Therefore, the rotation (tilting) of the shutter 19 and the heat shield 18 (or only the heat shield 18) may be carried out using a tilting mechanism for a system stage which holds the specimen cryo holder 13, or may be carried out manually.

Naturally, at the time of observation, also, the locking mechanism 26 is set in an unlocking state. This ensures that the cooling source 16 held in the inner dewar 23 can be kept in a horizontal state, irrespectively of the processing/observation direction for the thin film specimen.

<Shutter Function>

Figure 4:
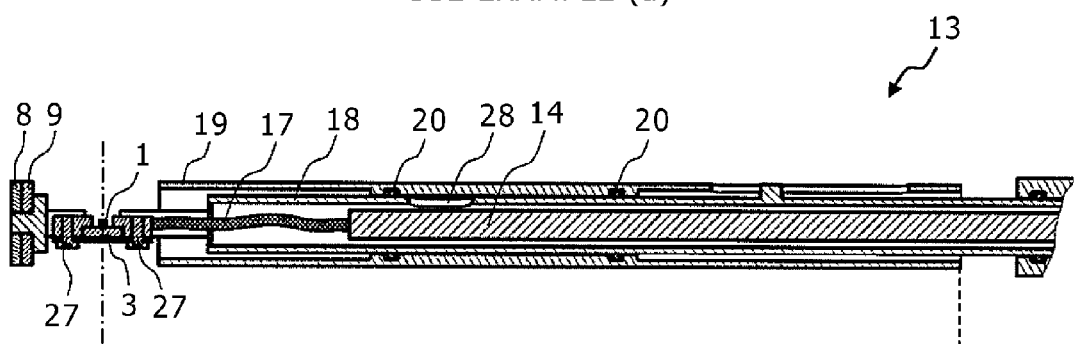
FIG. 4 shows views illustrating a use state of the specimen cryo holder at the time of processing/observation of a specimen and a use state of the specimen cryo holder at the time of shielding of an atmosphere.
Figure 4:
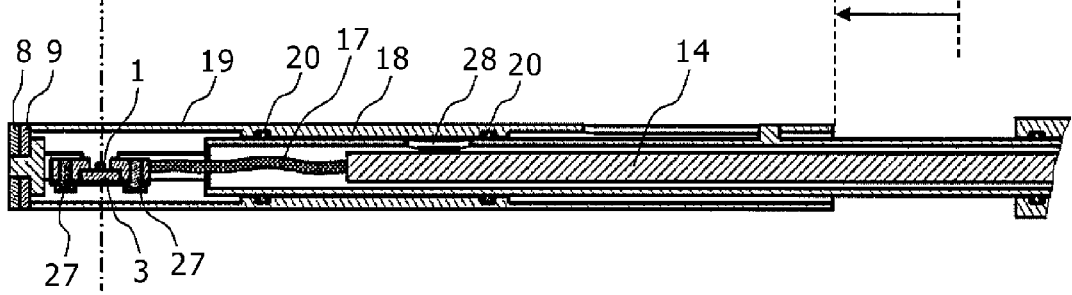

In the next place, an example of use of the shutter 19 will be described. The shutter 19 is provided for avoiding damaging or contamination of the specimen during transport of the specimen cryo holder 13 between systems. Use Example (a) shown at the top in FIG. 4 indicates the position of the shutter 19 during processing/observation of the specimen, whereas Use Example (b) shown at the bottom in FIG. 4 indicates the position of the shutter 19 during transport. At the time of transport, the shutter 19 constituting the outer tube is slid toward the tip of the heat shield 18 along the surface of the heat shield 18 constituting the inner tube, to define a closed space when its end face abuts on the holder tip shield 9.

FIG. 5 depicts the structure of a tip part of the specimen cryo holder 13. The holder tip shield 9 is formed of an arbitrary material. Where the holder tip shield 9 is formed by use of a material having a shielding performance (for example, rubber), evacuation is conducted via an evacuation port 28 formed in a housing of the heat shield 18, whereby the specimen 1 can be moved between the systems, with the inside of the specimen cryo holder 13 kept in vacuum. In addition, where the holder tip shield 9 is formed by use of a heat-resistant resin material (for example, fluororesin), the specimen 1 can be rapidly frozen by immersing the tip part of the specimen cryo holder 13 directly in the cooling medium.

<Mounting Structure for Cryo Specimen Base>

Figure 6A:
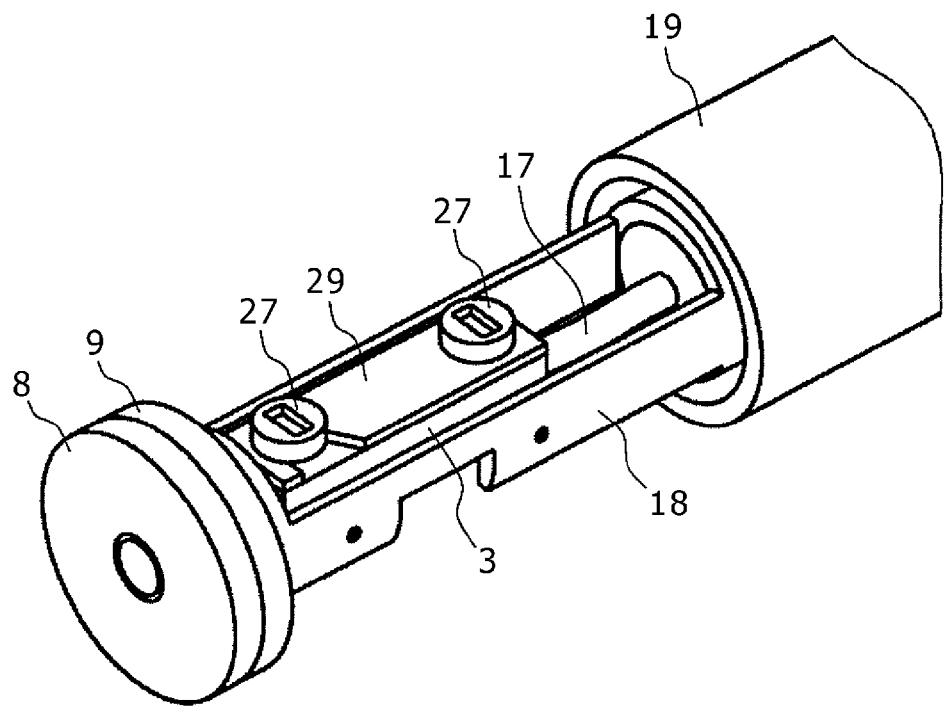
FIG. 6A is a perspective view illustrating a Mounted structure of a cryo specimen base mounted to the specimen cryo holder.
Figure 6B:
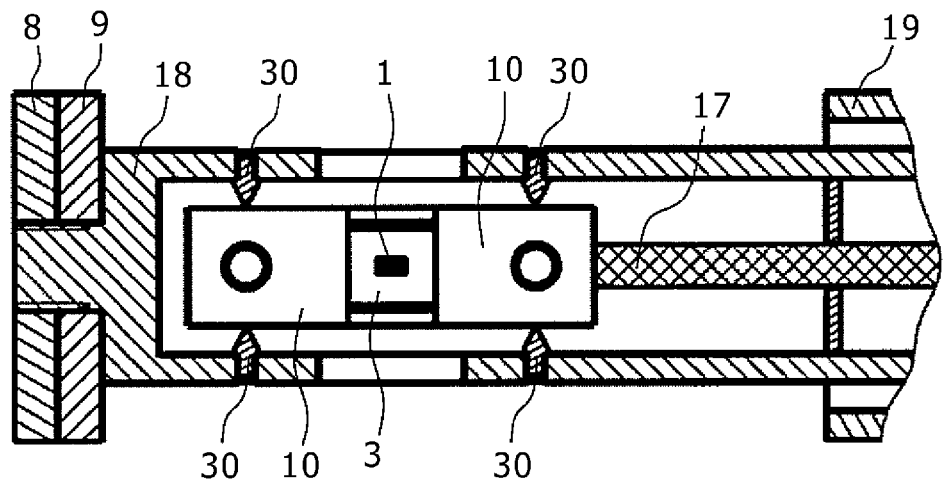
FIG. 6B is a plan view illustrating the mounted structure of the cryo specimen base mounted to the specimen cryo holder.

Here, using FIGS. 6A and 6B, a structure for mounting the cryo specimen base 3 to the specimen cryo holder 13 is illustrated. FIG. 6A depicts the mounting structure on the back side with respect to a mounting surface of the cryo specimen base 3, and FIG. 6B depicts the configuration as viewed from the side of the mounting surface of the cryo specimen base 3. In this embodiment, a structure is adopted in which the cryo specimen base 3 is clamped from both sides thereof by the cryo specimen base support 10 and a cryo specimen base presser 29 and is fixed in situ by fixing screws 27.

Note that a straight-line-shaped slot formed in the head of the fixing screw 27 is not formed to extend to opposite end edges of the screw head but is composed of a slot which is so formed that, as depicted in FIG. 6A, both its ends are located well inside the perimeter of the screw head and both its end portions are rectangular or semi-circular in shape. The adoption of this slot shape ensures that a tip of a minus screwdriver is less liable to slip off the slot at the time of mounting or detaching the cryo specimen base 3.

In addition, as illustrated in FIG. 6B, the cryo specimen base support 10 is fixed by four cone point parts 30 projecting from both sides of the arms possessed by the heat shield 18, so as to ensure that the heat propagated from the cooling source 16 through the cooling rod 14 and the flexible cooling transfer member 17 is reliably transmitted to the specimen 1.

<Dewar>

FIG. 7 depicts a sectional structure of the dewar. The dewar detachably mounted to the specimen cryo holder 13 is composed of: the cylindrical inner dewar 23 which holds the cooling source (e.g., liquid nitrogen) 16 therein; and the cylindrical outer dewar 21 which accommodates the inner dewar 23, with the heat shield 22 therebetween.

The upper surface of the inner dewar 23 is formed with two openings, and cylindrical pipes are so mounted as to extend upward from the two openings. One-side ends of the two pipes are connected respectively to holes of the same shape which are formed in the outer dewar 21. This connection ensures that a space defined by the inner dewar 23 and the outer dewar 21 forms the heat shield 22. Note that one of the two openings is used as a cooling rod insertion port 31a in which to insert the cooling rod 14, and the other is used as a cooling source introduction port 31b for introduction of the cooling source 16. Note that the designations of the cooling rod insertion port 31a and the cooling source introduction port 31b are merely expedient ones, so that either of the two ports may be used for insertion of the cooling rod 14 and the other for introduction of the cooling source 16.

In addition, the lower surface of the outer dewar 21 is formed with the evacuation port 24, and the vacuum maintenance cap 25 is attached to the evacuation port 24. The evacuation port 24 is used for evacuating the heat shield 22. The vacuum maintenance cap 25 is used for maintaining the heat shield 22 evacuated in a high vacuum state.

<Summary>

As has been described above, the use of the specimen cryo holder 13 ensures that the orientation of the dewar mounted to the dewar mounting part 15 of the specimen cryo holder 13 can always be maintained in the direction of gravity even when the orientation (tilt) of the specimen is changed for processing or observation. Therefore, where the specimen cryo holder 13 is used, bubbling of liquid nitrogen, liquid helium or the like used as the cooling source 16 would not occur even upon a change in the orientation (tilt) of the specimen. As a result, propagation of bubbling-induced vibrations to the specimen 1 is obviated, so that the accuracy of observation and processing can be enhanced.

Naturally, the temperature of the cooling source 16 is propagated to the specimen 1 by way of the cooling rod 14, the flexible cooling transfer member 17, the cryo specimen base support 10 and the cryo specimen base 3. Therefore, observation/processing with cooling of the specimen 1 can also be performed. Note that the flexible cooling transfer member 17 is excellent in thermal conductivity and, therefore, a sufficient quantity of heat can be propagated therethrough to the specimen 1.

The aforementioned technical effects are realized because the specimen cryo holder has the following characteristic features.

The features are:

(1) that the specimen 1 and the cryo specimen base support 10 on which to mount the cryo specimen base 3 are linked to each other by way of the cooling rod 14 deformable at least in twisting directions, and the specimen 1 can be rotated (tilted) independently of the cooling rod 14; and (2) that the cooling rod 14 is not fixed to the heat shield 18 constituting the inner tube or the dewar mounting part 15.

In addition, the dewar according to this embodiment is attachable to and detachable from the specimen cryo holder 13 (specifically, the dewar mounting part 15). Where it is unnecessary to cool the specimen 1, therefore, the dewar can be detached from the specimen cryo holder 13. Besides, in the dewar according to this embodiment, the outer dewar 21 constituting the outer tube is provided with the vacuum maintenance cap 25, which ensures that if evacuation is carried, out each time observation or processing is performed, the observation and processing can be carried out under a high degree of vacuum at all times. This makes it possible to maintain the temperature of the cooling source for a long period of time, and to perform a continuous operation for a long time. Besides, since a continuous operation can thus be performed, a total operation time necessary for processing and observation can be greatly shortened. As a result, a rapid development of materials analysis and research can be realized. In particular, a wide range of application can be expected in the fields of materials analysis and research involving anisotropy.

DESCRIPTION OF REFERENCE SYMBOLS

1 . . . Specimen, 2 . . . Processing/observation region, 3 . . . Cryo specimen base, 4 . . . Space, 5 . . . Charged particles, 6 . . . Charged particles, 7 . . . Signal, 8 . . . Holder tip shield retainer, 9 . . . Holder tip shield, 10 . . . Cryo specimen base support, 11 . . . Holder receiving part, 12 . . . O-ring, 13 . . . Specimen cryo holder, 14 . . . Cooling rod (Second heat conduction member), 15 . . . Dewar mounting part, 16 . . . Cooling source, 17 . . . Flexible cooling transfer member (First heat conduction member), 18 . . . Heat shield (First tubular member), 19 . . . Shutter (Second tubular member), 20 . . . O-ring, 21 . . . Outer dewar, 22 . . . Heat shield, 23 . . . inner dewar, 24 . . . Evacuation port, 25 . . . Vacuum maintenance cap, 26 . . . Locking mechanism, 27 . . . Fixing screw, 28 . . . Evacuation port, 29 . . . Cryo specimen base presser, 30 . . . Cone point part, 31*a* . . . Cooling rod insertion port, 31*b* . . . Cooling source introduction port.

The invention claimed is:

1. A specimen cryo holder comprising:
a cryo specimen base support to which to mount a cryo specimen base carrying thereon a specimen to be processed or observed using charged particles;
a first heat conduction member transmitting heat transmitted from a cooling source to the cryo specimen base support, the first heat conduction member being deformed according to a change in orientation of the specimen;
a second heat conduction member transmitting heat of the cooling source to the first heat conduction member;
a first tubular member; and
a dewar mounting part on which a dewar containing the cooling source is detachably mounted, wherein
a tip portion of the first heat conduction member is fixed to the cryo specimen base support, and
the first tubular member is attached rotatably to the dewar mounting part, accommodates the first and second heat conduction members such that the first and second heat conduction members are movable in an internal space of the first tubular member, and inclines the sample by rotating independently of the second heat conduction member and the dewar.

2. The specimen cryo holder according to claim 1, further comprising:
a second tubular member accommodating the first tubular member inside thereof; and
a holder tip shield fixed to the tip portion of the first heat conduction member, wherein
the holder tip shield defines a closed space by making contact with a tip-side end face of the second tubular member when slid toward the tip portion of the first heat conduction member along an outer surface of the first tubular member.

3. The specimen cryo holder according to claim 2, wherein the first tubular member is provided with an evacuation port used when the closed space is evacuated.

4. The specimen cryo holder according to claim 2, wherein the holder tip shield is a vacuum sealing packing.

5. The specimen cryo holder according to claim 2, wherein the holder tip shield is a member made of a heat-resistant resin.

6. The specimen cryo holder according to claim 1, wherein the cryo specimen base is mounted to the cryo specimen base support by a fixing screw having a minus-shaped slot in a screw head, with none of opposite ends of the slot reaching an end edge of the screw head.

7. The specimen cryo holder according to claim 1, wherein the cryo specimen base support is fixed to the first tubular member through point contact.

8. The specimen cryo holder according to claim 1, wherein the dewar, containing the cooling source comprises:
an inner dewar having at least an opening into which to insert one end of the second heat conduction member, the inner dewar holding in an internal space thereof a cooling source introduced from outside;
an outer dewar adapted to vacuum-insulate the inner dewar; and
a vacuum maintenance cap attached to an evacuation port formed in a part of the outer dewar, the vacuum maintenance cap maintaining a closed space for vacuum insulation in a vacuum state.

9. The specimen cryo holder according to claim 8, wherein the inner dewar is provided, separately from the opening into which to insert the end of the second heat conduction member, with an opening for exclusive use for introduction of the cooling source.

* * * * *